(12) United States Patent
Dupuy et al.

(10) Patent No.: US 9,490,863 B2
(45) Date of Patent: Nov. 8, 2016

(54) PROVISION OF LINEARITY ENHANCEMENT FOR RF COMMUNICATION DEVICES

(71) Applicant: ETHERTRONICS, Inc., San Diego, CA (US)

(72) Inventors: Alexandre Dupuy, San Diego, CA (US); Laurent Desclos, San Diego, CA (US)

(73) Assignee: ETHERTRONICS, INC., San Diego, CA (US)

(*) Notice: Subject to any disclaimer, the term of this patent is extended or adjusted under 35 U.S.C. 154(b) by 400 days.

(21) Appl. No.: 13/717,550

(22) Filed: Dec. 17, 2012

(65) Prior Publication Data

US 2014/0170994 A1    Jun. 19, 2014

(51) Int. Cl.
| | | |
|---|---|---|
| *H04B 1/44* | (2006.01) | |
| *H04B 1/40* | (2015.01) | |
| *H03K 17/06* | (2006.01) | |
| *H03K 17/16* | (2006.01) | |
| *H03H 7/40* | (2006.01) | |
| *H03H 7/38* | (2006.01) | |

(52) U.S. Cl.
CPC ............... *H04B 1/44* (2013.01); *H03H 7/40* (2013.01); *H03K 17/063* (2013.01); *H03K 17/161* (2013.01); *H03H 2007/386* (2013.01); *H03K 2217/0018* (2013.01)

(58) Field of Classification Search
CPC ..... H01L 27/0222; H01L 27/02; H04B 1/44; H04B 1/48; H04B 1/40
USPC .......... 455/78, 88, 550.1, 552.1, 553.1, 101, 455/120, 121, 132, 133, 140, 168.1, 176.1, 455/178.1, 180.1, 188.1, 252.1, 333
See application file for complete search history.

(56) References Cited

U.S. PATENT DOCUMENTS

| | | | |
|---|---|---|---|
| 7,184,717 B2* | 2/2007 | Rose et al. ....................... 455/83 |
| 8,368,470 B2* | 2/2013 | Alidio et al. ................. 330/295 |
| 8,880,006 B2* | 11/2014 | Caron ...................... H04B 1/48 |
| | | | 455/73 |
| 9,019,010 B2* | 4/2015 | Costa ...................... H03F 3/193 |
| | | | 330/124 R |
| 2001/0041548 A1* | 11/2001 | Bult ........................ H03F 3/195 |
| | | | 455/252.1 |
| 2013/0109434 A1* | 5/2013 | Dupuy et al. ............... 455/552.1 |
| 2014/0104132 A1* | 4/2014 | Bakalski et al. .............. 343/861 |

* cited by examiner

*Primary Examiner* — Andrew Wendell
(74) *Attorney, Agent, or Firm* — Coastal Patent Law Group, P.C.

(57) ABSTRACT

A switch is provided, the switch including one or more banks of transistors fabricated on a substrate, wherein body terminals of the transistors in each bank are configured to be individually controlled to have respective body voltages. The values of the body voltages are determined to provide optimum linearity of power transfer by changing properties of the substrate with respect to the properties of the substrate when the body voltages are commonly biased at a value.

16 Claims, 16 Drawing Sheets

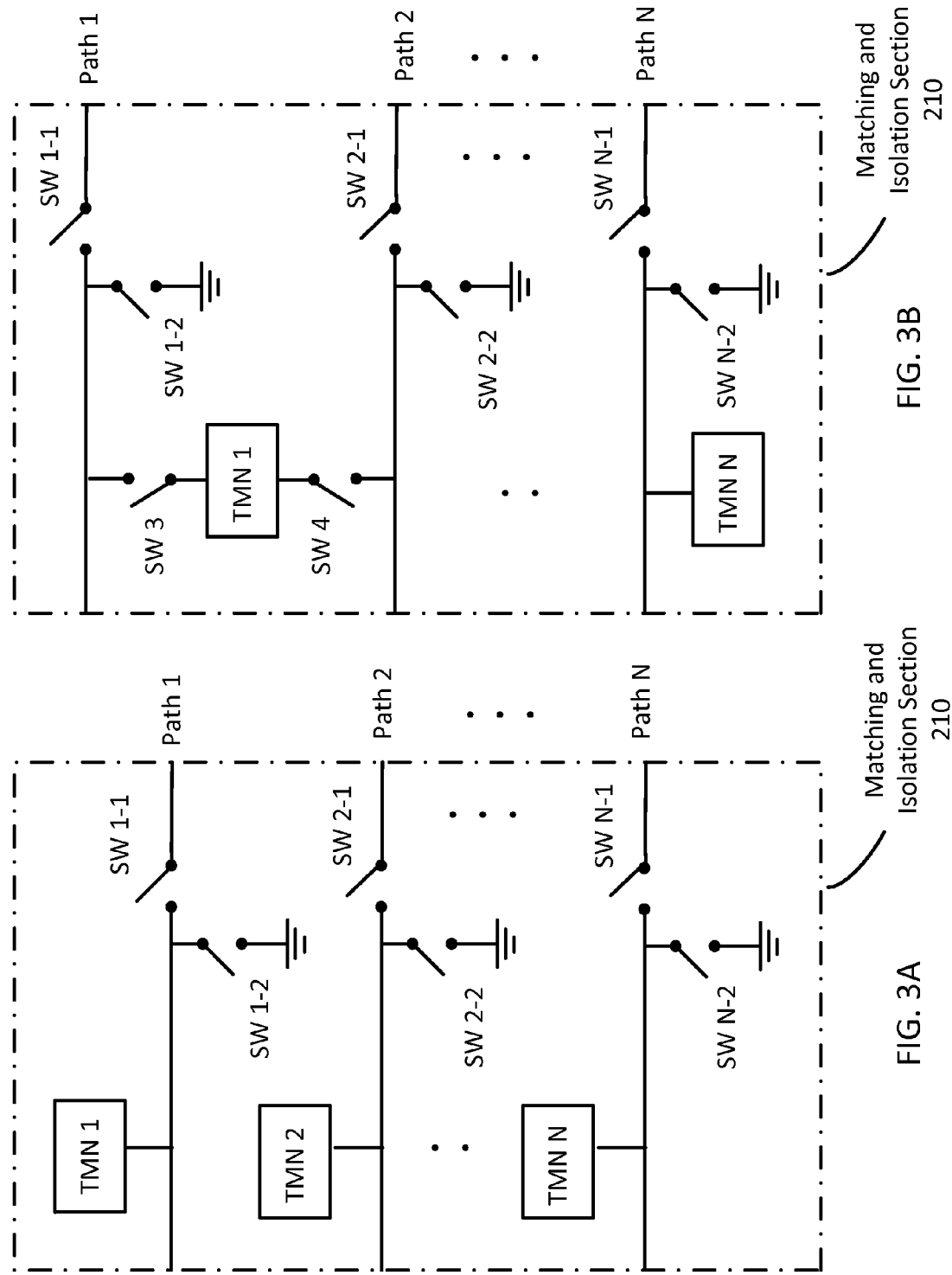

| Condition | Band | C1 (pF) | C2 (pF) | L1 (nH) | L2 (nH) | ... |
|---|---|---|---|---|---|---|
| 1 | 1 | 0.1 | 0.5 | 0.5 | 1 | |
| 1 | 2 | 1 | 3 | 2 | 6 | |
| 1 | 3 | 2 | 5 | 10 | 15 | |
| 1 | 4 | 10 | 30 | 5 | 3 | |
| 2 | 1 | 3 | 0.1 | 3 | 7 | |
| 2 | 2 | 5 | 2 | 10 | 4 | |
| 2 | 3 | 15 | 20 | 20 | 9 | |
| 2 | 4 | 1 | 3 | 5 | 20 | |
| 3 | 1 | 6 | 5 | 0 | 30 | |
| 3 | 2 | 0 | 8 | 0 | 8 | |
| 3 | 3 | 8 | 0.5 | 15 | 0 | |
| 3 | 4 | 12 | 0 | 3 | 2 | |
| ... | | | | | | |

FIG. 4

PROVISION OF LINEARITY ENHANCEMENT FOR RF COMMUNICATION DEVICES

CROSS REFERENCE

The present application is related to the U.S. application Ser. No. 13/548,211, entitled "MULTI-FEED ANTENNA FOR PATH OPTIMIZATION," filed on Jul. 13, 2012, the U.S. application Ser. No. 13/608,883, entitled "COMMUNICATION SYSTEMS WITH ENHANCED ISOLATION PROVISION AND OPTIMIZED IMPEDANCE MATCHING," filed on Sep. 10, 2012, the U.S. patent application Ser. No. 13/675,981, entitled "TUNABLE MATCHING NETWORK FOR ANTENNA SYSTEMS," filed on Nov. 13, 2012, and the U.S. patent application Ser. No. 13/717,519, entitled "MULTI-BAND COMMUNICATION SYSTEM WITH ISOLATION AND IMPEDANCE MATCHING PROVISION," filed on Dec. 17, 2012. The entire contents of each of the above U.S. Applications are incorporated herein by reference.

BACKGROUND OF THE INVENTION

Frequency bands and modes associated with various protocols are specified per industry standards for cell phone and mobile device applications, WiFi applications, WiMax applications and other wireless communication applications, and the number of specified bands and modes is increasing as the demand pushes. Laptops, tablets, personal digital assistants, cellular phones, smart phones and other mobile devices include a communication system which may be designed to have paths or chains to process signals in multiple modes and bands.

As new generations of wireless communication devices become smaller and packed with more multi-mode multi-band functions, designing new types of antennas and associated air interface circuits is becoming increasingly important. In particular, a mobile device with an air interface tends to be affected by use conditions such as the presence of a human hand, a head, a metal object or other interference-causing objects placed in the vicinity of the antenna, resulting in impedance mismatch and frequency shift at the antenna terminal. Accordingly, an impedance matching scheme is required in the device to optimize the performance by adjusting the impedance over multiple bands and modes using as little real estate as possible. Signals in different frequency bands in such a dense RF circuitry tend to interfere with each other, and in some cases even damage sensitive components if the gap between the frequency bands is small. Therefore, a proper isolation provision needs to be considered in designing such a multi-mode multi-band system having multiple paths therein. In addition to the impedance matching and isolation considerations, obtaining high linearity is important to maintain the integrity of the signal and power transfer with minimal distortion. A present-day RF communication system for mobile applications generally includes several chip-set solutions with several external components. As these parts get more and more integrated on a chip to achieve a small real estate, high speed switching and power consumption reduction, optimizations of impedance matching, isolation and linearity call for considerations of various aspects of the fabrication technology used for the integration.

BRIEF DESCRIPTION OF THE DRAWINGS

FIGS. 3A and 3B illustrate configuration variations of the tunable matching networks and switches in the matching and isolation section.

FIG. 4 illustrates an example of the look-up table (LUT) 216 in FIG. 2.

DETAILED DESCRIPTION

Figure 1:
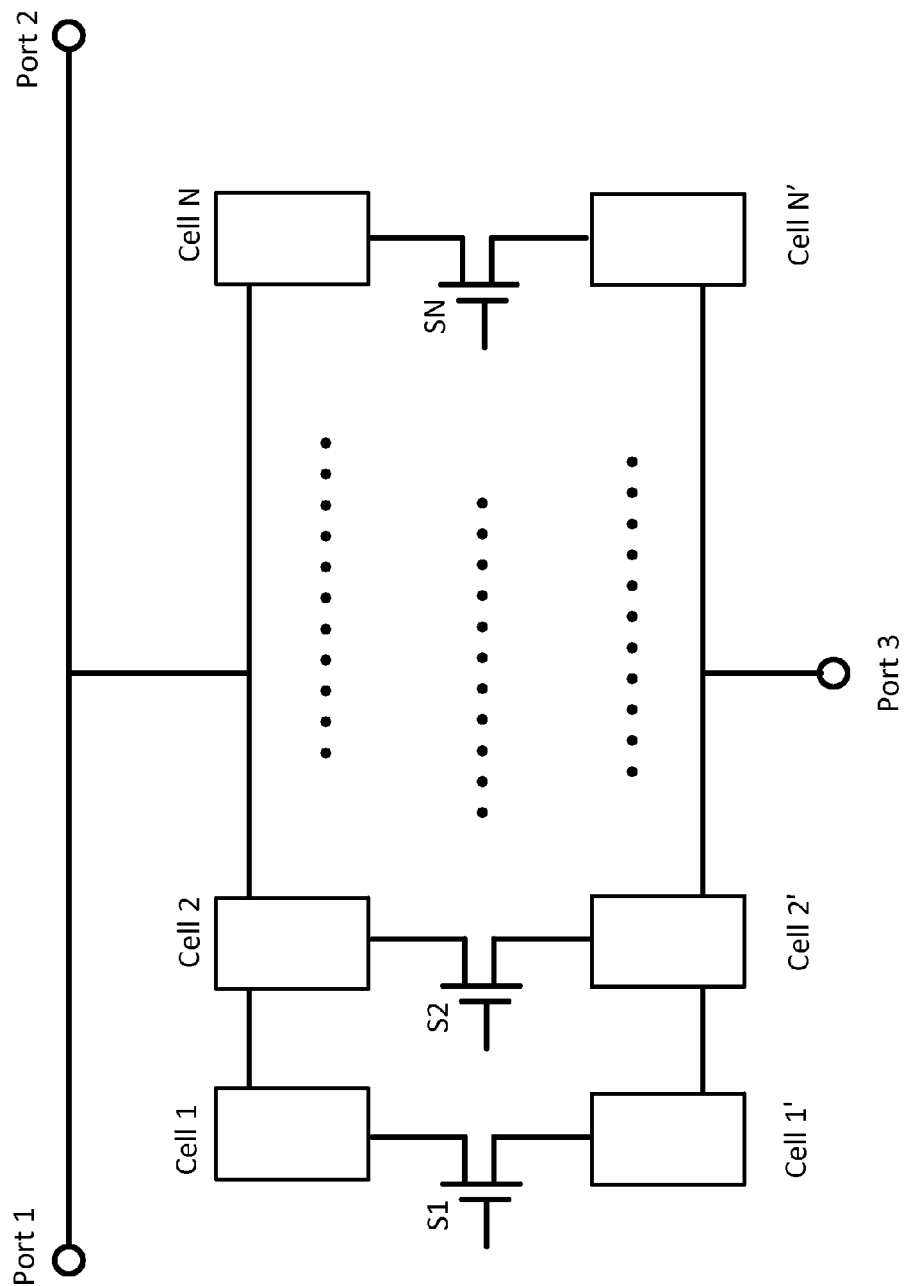
FIG. 1 illustrates an example of a configuration of the tunable matching network according to the tailored matching scheme.

An RF communication system used for cell phone, smart phone and other mobile device applications can generally be designed to support one or more modes and frequency bands. A single antenna may be used to cover both transmit (Tx) and receive (Rx) bands in a conventional multi-band system. A single-pole-multiple-throw or a multiple-pole-multiple-throw switch may be employed for the single antenna system to engage one of the multiple RF paths according to the frequency band of the signal received from or transmitted to the antenna. Such a switch can provide a certain level of isolation among the multiple RF paths in the system.

In addition to isolation considerations, the practical implementation of RF communication systems involves matching of different impedances of coupled blocks to achieve proper transfer of signal and power. Such implementation tasks include the matching from an antenna to a low noise amplifier (LNA) input, as well as from a power amplifier (PA) output to an antenna. The 50 Ω matching is employed for a typical communication system, whereby matching networks may be provided inside or outside the LNA, as well as inside or outside the PA. Note, however, that LNAs or PAs generally have low efficiency in the proximity of 50 Ω: in today's RF amplifier technologies, LNAs may have optimum efficiency at high impedance, e.g., ~200 Ω, and PAs may have optimum efficiency at low impedance, e.g. ~5 Ω.

To improve the isolation and impedance matching, a multi-feed antenna, which can be coupled to two or more RF paths, may be used to provide isolation among the paths by providing the physical separation of the paths as well as providing first-order impedance matching for each path. Examples and implementations of multi-feed antennas are described in the U.S. application Ser. No. 13/548,211, entitled "MULTI-FEED ANTENNA FOR PATH OPTIMIZATION," filed on Jul. 13, 2012. In particular, the isolation of Tx and Rx paths with individual impedance matching is considered based on the above multi-feed antenna in the U.S. application Ser. No. 13/608,883, entitled "COMMUNICATION SYSTEMS WITH ENHANCED ISOLATION PROVISION AND OPTIMIZED IMPEDANCE MATCHING," filed on Sep. 10, 2012.

A conventional communication system with a passive antenna generally is not capable of readjusting its functionality to recover optimum performances when a change in impedance detunes the antenna, causing a change in system load and a shift in frequency. A tunable antenna can be used to adjust the perturbed properties by controlling the beam, frequency response, impedance and other antenna characteristics so as to recover the optimum performances. See, for example, U.S. Pat. Nos. 6,900,773, 7,830,320 and 7,911,402, which describe examples of active tunable antennas. Additionally or alternatively, a tunable matching network can be used to provide proper impedance dynamically according to the frequency band selected and the use condition and/or the environment during a time interval based on input information. U.S. patent application Ser. No. 13/675,981, entitled "TUNABLE MATCHING NETWORK FOR ANTENNA SYSTEMS," filed on Nov. 13, 2012, describes a flexible and tailored matching scheme capable of maintaining the optimum system performances as frequency bands, conditions, environments and surroundings vary with time. In other words, this matching scheme provides matching network configurations having impedance values tailored for individual scenarios. This scheme is fundamentally different from a conventional scheme of providing beforehand impedance values corresponding to discrete points in the Smith chart based on combinations of fixed capacitance values, which may be unnecessarily excessive, wasting real estate, and/or missing optimum impedance values. Specifically, in the conventional fixed-capacitance scheme, termed a binary scheme herein, the capacitors and switches are binary-weighted from a least significant bit (LSB) to a most significant bit (MSB). On the other hand, in the tailored scheme, impedance values are optimized in advance according to frequency bands and detectable conditions including use conditions and environments.

FIG. 1 illustrates an example of a configuration of the tunable matching network (TMN) according to the tailored matching scheme. The configuration of FIG. 1 includes multiple switches, S1, S2 . . . and SN; and component blocks, cell 1, cell 2 . . . and cell N, and cell 1', cell 2' . . . and cell N'. Each switch is coupled to a first cell on one side and a second cell on the other side in series. The branches, each branch having a switch, a first cell on one side of the switch and the second cell on the other side of the switch, are coupled together in parallel. A simplified configuration is possible by including only the first set of cells, cell 1, cell 2 . . . and cell N, each coupled to a switch. See the U.S. patent application Ser. No. 13/675,981, entitled "TUNABLE MATCHING NETWORK FOR ANTENNA SYSTEMS," filed on Nov. 13, 2012, for more configuration examples of the tunable matching network. One end of the paralleled branches is coupled to the path coupled to port 1 and port 2; and the other end of the paralleled branches is coupled to port 3. This configuration may provide convenience and ease in designing a shunt circuit by coupling ports 1 and 2 to the RF path, with an option of coupling port 3 to another circuit, module or component in the system, shorting it to ground or keeping it open. This configuration can also be used as a series circuit by coupling port 1 (or 2) and port 3 to the RF path, with an option of coupling port 2 (or 1) to another circuit, module or component in the system, shorting it to ground or keeping it open. Each cell may include one or more components such as capacitors and/or inductors. The gate (or base) terminals of the switches S1, S2 . . . and SN are controlled by a controller. By turning on one of the switches, this tunable matching network can provide N possible impedance states, which are determined by the combinations of cell 1+cell 1', cell 2+cell 2' . . . and cell N+cell N'. Furthermore, additional impedance states can be provided by turning on two or more switches. Thus, the tuning matching network is capable of providing customized impedance states that are predetermined based on frequency bands and expected conditions, environments and others.

In view of the isolation and impedance matching considerations for a multi-mode multi-band communication system having multiple paths, the U.S. patent application Ser. No. 13/717,519, entitled "MULTI-BAND COMMUNICATION SYSTEM WITH ISOLATION AND IMPEDANCE MATCHING PROVISION," filed on Dec. 17, 2012, provides implementations and examples of communication systems configured to provide enhanced isolation and impedance matching. This provision is based on the above tailored scheme for impedance matching and use of multi-feed antennas and multiple switches for enhanced isolation. The entire content of this application is incorporated herein by reference and summarized below.

Figure 2:
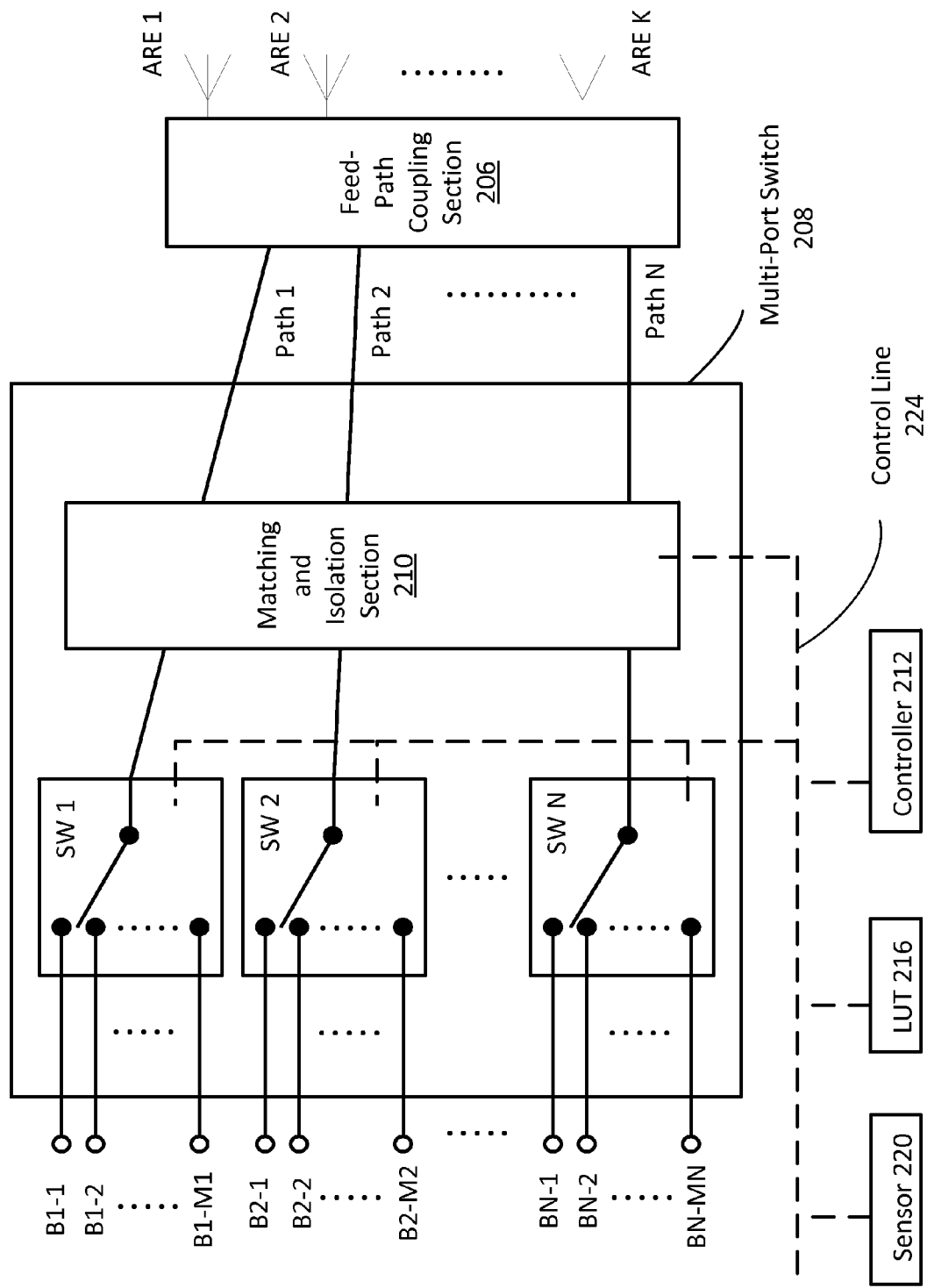
FIG. 2 illustrates an example of a configuration of a multi-band communication system.

FIG. 2 illustrates an example of a configuration of a multi-band communication system, the configuration incorporating a multi-feed antenna, a matching and isolation section and switches. In this example, the multi-feed antenna is specifically illustrated to have K-number of antenna radiating elements, labeled ARE 1, ARE 2 . . . and ARE K. The feed ports of the antenna are configured to couple to multiple paths, i.e., path 1, path 2, . . . and path N, respectively, corresponding to N different mode/band combinations in the communication system, thereby providing physical separation of the paths. The antenna radiating elements and the feeds may be configured to have different numbers. For example, two or more antenna radiating elements that are designed to receive or transmit signals in two more different bands, respectively, may be coupled to one feed. Additionally, one antenna radiating element coupled to one feed can be configured to receive or transmit signals in two or more different bands. Therefore, the number of antenna radiating elements K may be equal to or different from the number of paths N, i.e., K=N or K≠N. In the example of FIG. 2, the multi-feed antenna having the antenna radiating elements ARE 1, ARE 2 . . . and ARE K, is configured to couple to path 1, path 2 . . . and path N through a feed-path coupling section 206, where N is the number of feeds of the multi-feed antenna as well as the number of paths. The feed-path coupling section 206 is configured to couple the antenna feeds to the path 1, path 2 . . . and path N, respectively, in a capacitive way, an inductive way, a combination of both or other suitable methods.

A multi-port switch 208 includes a matching and isolation section 210 and N-number of single-pole-multiple-throw switches, SW 1, SW 2 . . . and SW N. The path 1 is configured to support RF signals in a first group of bands, labeled B1-1, B1-2 . . . and B1-M1, where this first group includes M1-number of bands; the path 2 is configured to support RF signals in a second group of bands, labeled B2-1, B2-2 . . . and B2-M2, where this second group includes M2-number of bands; . . . ; and the path N is configured to support RF signals in an N-th group of bands, labeled BN-1, BN-2 . . . and BN-MN, where this N-th group includes MN-number of bands. The multi-port switch 208 is configured to couple to the multiple paths, labeled path 1, path 2 . . . and path N, from the feed-path coupling section 206 on one side and the other multiple paths, labeled B1-1, B1-2 . . . and BN-MN, on the other side to process signals respectively in multiple bands. The multi-port switch 208 includes the multiple single-pole-multiple-throw switches, SW 1, SW 2 . . . and SW N, corresponding to the first group of bands, the second group of bands . . . and the N-th group of bands, respectively. Each of the single-pole-multiple-throw switches is used to engage one of the paths corresponding to one of the bands in the group to process the signal in the particular band.

Figure 3:
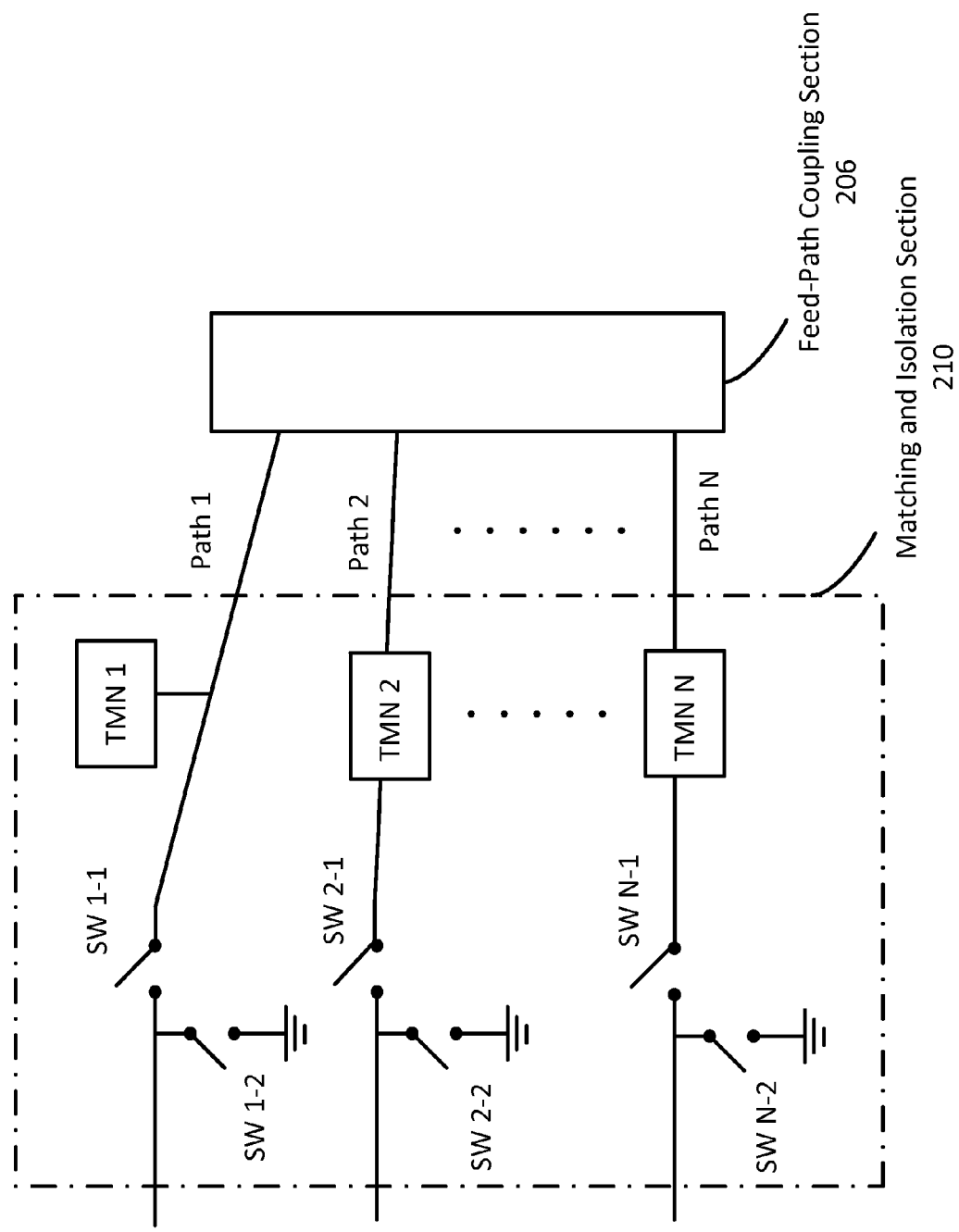
FIG. 3 illustrates an example of the matching and isolation section 210 in FIG. 2.

FIG. 3 illustrates an example of the matching and isolation section 210 in FIG. 2. The path 1 is configured to support RF signals in a first group of bands; the path 2 is configured to support RF signals in a second group of bands; . . . ; and the path N is configured to support RF signals in an N-th group of bands. Multiple tunable matching networks, labeled TMN 1, TMN 2 . . . and TMN N, are coupled to the path 1, path 2 . . . and path N, respectively, in this example. Each of the tunable matching networks is used to dynamically provide optimum impedance for the bands in the group and the condition detected during each time interval. Additional to the tunable matching networks, the configuration of the matching and isolation section 210 in FIG. 10 includes a pair of switches in shunt and in series for each path. For example, the path 1 has a series switch SW 1-1 and a shunt switch SW 1-2; the path 2 has a series switch SW 2-1 and a shunt switch 2-2; . . . ; and the path N has a series switch SW N-1 and a shunt switch SW N-2. These switches may be controlled to provide enhanced isolation. For example, the series switch for the path 1, SW 1-1, may be turned on and the shunt switch for the path 1, SW 1-2, is turned off; while the series switch for the path 2, SW 2-1, is turned off and the shunt switch for the path 2, SW 2-2, is turned on. This switch state provides enhanced isolation for the paths 1 and 2 when the signal is transmitting in the path 1 by shutting off the path 2, thereby reducing power leakage from one path to the other.

Alternatively, a number of variations can be configured for the matching and isolation section 210. FIGS. 3A and 3B illustrate configuration variations of the tunable matching networks and switches in the matching and isolation section 210. The inputs and the outputs of the matching and isolation section 210 can be on either side. FIG. 3A illustrates an example in which the series and shunt switches are placed on the antenna side of the tunable matching networks, TMN 1 is coupled in shunt with the path 1, TMN 2 is coupled in shunt with the path 2, . . . and TMN N is coupled in shunt with the path N. FIG. 3B illustrates an example in which TMN 1 is coupled in shunt with the path 1 through a switch SW 3 and is also coupled in shunt with the path 2 through a switch SW 4. The switches associated with the paths 1 and 2 may be controlled to enhance isolation while providing proper matching. For example, the signals for the path 1 can be processed with high isolation and matching by turning on the switches SW 1-1, SW 3 and SW 2-2, while leaving the switches SW 1-2, SW 4 and SW 2-1 off. Similarly, the signals for the path 2 can be processed with high isolation and matching by turning on the switches SW 2-1, SW 4 and SW 1-2, while leaving the switches SW 2-2, SW 3 and SW 1-1 off. Therefore, by controlling the switches, TMN 1 can be engaged with the path that is engaged for signal processing by turning on the associated series switch, while being disengaged from the other path.

Figures 3C, 3D:
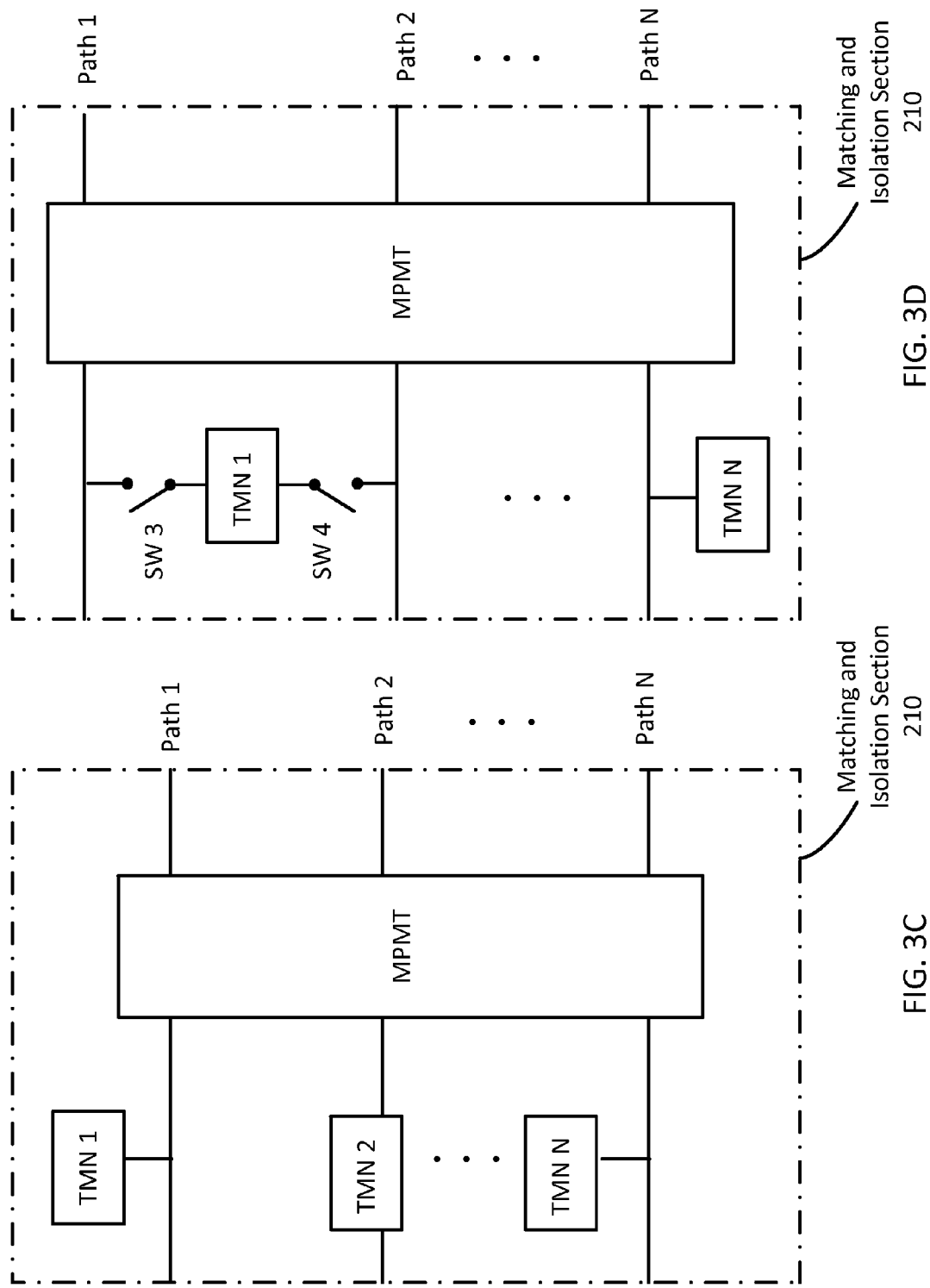
FIGS. 3C and 3D illustrate configuration examples of the matching and isolation section 210 including a multiple-pole-multiple-throw (MPMT) switch.

In the above examples, the switches are represented as single-pole-single-throw (SPST) switches. Part or all the multiple SPST switches in the matching and isolation section 210 may be replaced with a multiple-pole-multiple-throw (MPMT) switch having N-number of input ports and M-number of output ports. When N=M, the MPMT switch is called symmetric; when N≠M, it is called asymmetric. FIG. 3C illustrates an example of a configuration of the matching and isolation section 210 including an MPMT switch. The tunable matching networks, TMN 1, TMN 2 . . . and TMN N, are coupled respectively to the RF paths, path 1, path 2 . . . and path N, each in shunt or in series in this example. The MPMT is configured to include the functionality corresponding to one or more SPST switches in shunt and/or one or more SPST switches in series. FIG. 3D illustrates another example of a configuration of the matching and isolation section 210 including an MPMT switch. The tunable matching network TMN 1 is coupled in shunt with the path 1 through a switch SW 3 and is also coupled in shunt with the path 2 through a switch SW 4 in this example. The other tunable matching networks are coupled to their respective paths, each in shunt or in series. The MPMT is configured to include the functionality corresponding to one or more SPST switches in shunt and/or one or more SPST switches in series.

Figure 3E:
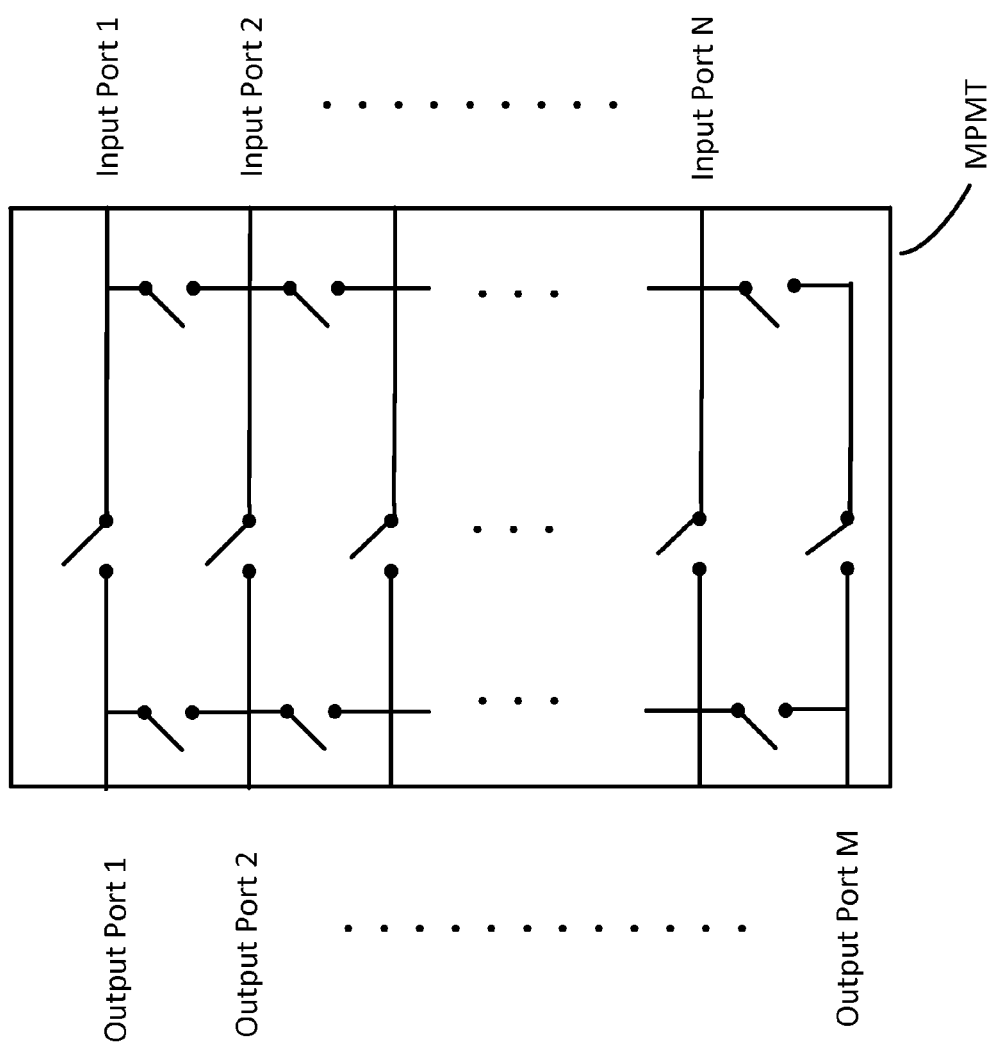
FIG. 3E illustrates an example of a configuration of single-pole-single-throw (SPST) switches in an MTMP switch.

FIG. 3E illustrates an example of a configuration of SPST switches in an MTMP switch. This example illustrates an asymmetric case where there are input ports 1, 2 . . . and N, and output ports 1, 2 . . . and M. This can be made symmetric by configuring the switches to have M=N. Each SPST switch in shunt may have an open end or be coupled to another RF path, a component, a module or to ground. The input ports and output ports may be flipped. The shunt switches and the series switches may be placed in the MPMT in a symmetric fashion, asymmetric fashion, or any configuration. Thus, the number and the configuration of the SPST switches in the MPMT switch may be varied in a wide variety of ways depending on applications. The MPMT may be configured to further include a component or a module providing impedance and/or variable impedance to handle matching, parasitics, etc.

Turning back to FIG. 2, a controller 212, a look-up table (LUT) 216 and a sensor 220 are coupled to each other through a control line 224, enabling the controller 212 to adjust the tunable matching networks, TMN 1, TMN 2 . . . and TMN N, based on input information. The controller 212 is further configured to control the single-pole-multiple-throw switches, SW 1, SW 2 . . . and SW N, to engage the paths corresponding to the bands to be processed, respectively. The sensor 220 may include one or more sensors such as a proximity sensor, a motion sensor, a light sensor, a pressure sensor or other types of sensors, to detect the use condition and/or the environment and send the detected information to the controller 212. The information on the selected band may be sent from a CPU or an application CPU in the system to the controller 212. The controller 212 is configured to include an algorithm to control each of the tunable matching networks, TMN 1, TMN 2 . . . and TMN N, to dynamically adjust the impedance according to the frequency band selected and the condition/environment detected during a time interval. The algorithm can be configured also to control the single-pole-multiple-throw switches, SW 1, SW 2 . . . and SW N, as well as the switches in the matching and isolation section 210, as illustrated in FIGS. 3-3D. The controller 212 may be located anywhere in the communication system, and may be integrated with the antenna 206, the multi-port switch 208, the matching and isolation section 210, or other parts in the communication system such as an application CPU. The LUT 216 tabulates measured and/or predetermined data associated with antenna characteristics, and the algorithm is configured to optimize the system performance with reference to the entries in the LUT 216 according to the frequency band selected and time-varying conditions/environments, such as perturbations due to the placement of a head, a hand, or other interference-causing objects nearby. The entries in the LUT 216 can be updated as needed, and the LUT 216 may be stored in a memory of the controller 212 or located outside the controller 212. The controller 212 and/or the LUT 216 may be implemented using a logic chip, such as a field-programmable gate array (FPGA), which supports thousands of gates, providing vast design flexibility and ability to update the functionality after shipping in the field. Alternatively, an application specific integrated circuit (ASIC) can also be used.

Bidirectional control can be realized, for example, by using an interface specified by the Mobile Industry Processor Interface (MIPI) Alliance, General Purpose Input/Output (GPIO), Serial Parallel Interface (SPI), or Inter-Integrated Circuit ($I^2C$). See, for example, a white paper entitled "Tuning Technology: Key Element to Lower Operating Costs While Improving Wireless Network Performance," released on Feb. 8, 2011, by IWPC (International Wireless Industry Consortium). The control line 224 may be designed to incorporate such bidirectional control using a conventional bus, wires, or other suitable forms.

FIG. 4 illustrates an example of the LUT 216. Measured and/or predetermined parameters under various conditions and/or specifications may be stored in the LUT 216 to adjust impedances and other properties. For example, the LUT 216 may include characterization data of the antenna, such as total radiated power (TRP), total isotropic sensitivity (TIS), specific absorption rate (SAR), radiation patterns and so on, which can be measured in advance for various conditions, e.g., in free space, in the presence of a head, a hand, laps, wood, metal, etc. with different positions and angles. Measured S parameters such as S12 and S11 may also be included. These LUT entries may be updated as needed so that the algorithm can converge faster to an optimum operation. The example in FIG. 4 shows a portion of the LUT 216, where the capacitance and inductance values, C1, C2, L1, L2 . . . in cells are listed according to conditions and bands. For example, condition 1 may refer to the presence of a head with an ear in parallel with the handset; condition 2 may refer to the presence of a metal touching the handset, etc. The device is assumed to operate over four bands 1, 2, 3, and 4 in this table; for example, the frequencies for the Tx of band 1 are 1920-1980 MHz, and the frequencies for the Rx of band 1 are 2110-2170 MHz, the frequencies for the Tx of band 2 are 1850-1910 MHz, and the frequencies for the Rx of band 2 are 1930-1950 MHz, the frequencies for the Tx of band 3 are 1710-1785 MHz, and the frequencies for the Rx of band 3 are 1805-1880 MHz, etc. The capacitance and inductance values may be predetermined through measurements of the S parameters, for example, for each band under each condition. The condition during a time interval can be detected by the sensor 220, and the information can be sent to the controller 212, which then refers to the LUT 216 to determine the values of C1, C2, L1, L2, etc. that can provide the optimum impedance state to recover optimum performances under the condition and for the selected band during the time interval. The predetermined impedance states, as tabulated in the LUT 216, are implemented by the cells of the tunable matching network, such as illustrated in FIG. 1. Accordingly, the controller 212 turns on one or more switches coupled to the cells that provide the optimum impedance for the band and the condition during the time interval.

As explained above with reference to FIGS. 1-4, the switches play an important role in the present tunable matching scheme in an RF communication system for providing the optimum impedance for each scenario during a time interval as well as for providing enhanced isolation for multiple RF paths. The form of the switch may be of single-pole-multiple-throw such as SW 1, SW 2 . . . and SW N in FIG. 2, of single-pole-single-throw such as S1, S2 . . . and SN in FIG. 1 and SW 1-1, SW 2-1 . . . SW N-2 in FIGS. 3, 3A and 3B, or of multiple-pole-multiple-throw such as the MPMT in FIGS. 3C and 3D. Part or all the switches in the system may be integrated on a chip, with or without the other components on the same ship, to provide a compact real estate with operational characteristics of a high speed semiconductor device. A conventional Si CMOS, silicon on insulator (SOI) CMOS, or any other suitable fabrication technology may be used for the integration. The SOI technology refers to the use of a layered silicon-insulator-silicon substrate in place of a conventional bulk silicon substrate. In an SOI-based device, the silicon junction is above the insulator layer, which is typically silicon dioxide. The use of high resistivity substrate is important to reduce high frequency losses associated with the substrate conductivity. Owing to the buried insulator layer in the SOI technology, the top silicon layer in which the transistors are implemented is electrically isolated from the silicon substrate. Thus, the structure can provide high resistivity, hence reduced substrate loss and coupling, without impacting the desired properties of the MOS integrated circuits. The insertion loss of a coplanar waveguide (CPW) line lying on a lossy silicon substrate depends substantially on the substrate loss, which is inversely proportional to the effective resistivity of the substrate. Therefore, the SOI technology is suited for RF and system-on-chip applications, providing high resistivity substrate capabilities, thereby leading to substantially reduced substrate losses, and hence improved insertion losses. When sapphire is chosen for the insulator layer, these types of devices are called silicon on sapphire (SOS).

Figure 5:
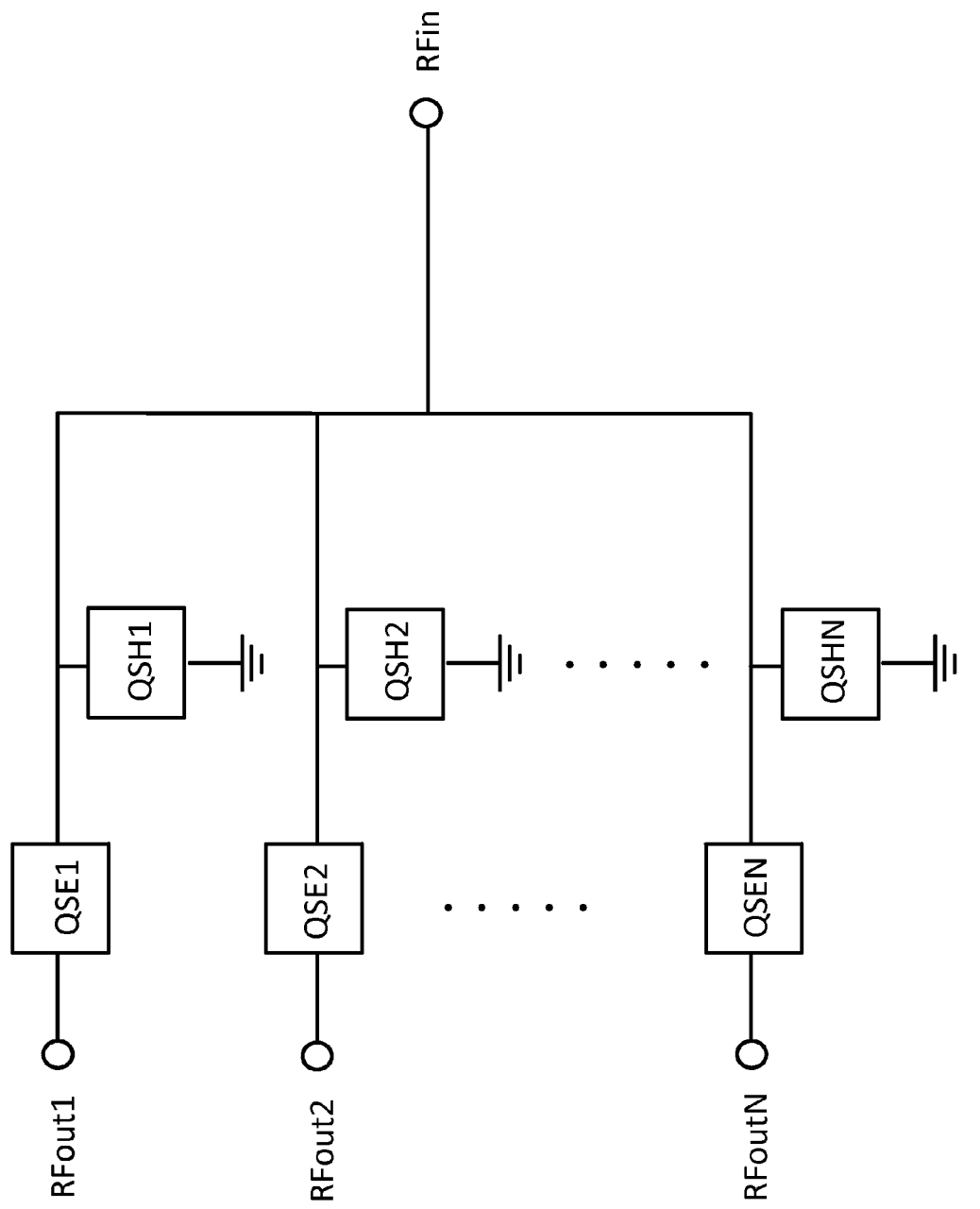
FIG. 5 illustrates an example of a switch based on integrated transistors.

FIG. 5 illustrates an example of a switch based on integrated transistors. This example has one input port labeled RFin and multiple output ports labeled RFout1, RFout2 . . . and RFoutN, indicating that this is a single-pole-N-throw switch. However, by setting N=1, this example is applicable to a single-pole-single-throw switch. The input and outputs may be flipped, that is, the switch can be implemented having the input and the output on either side. Note that a multiple-pole-multiple-throw switch is also possible for a configuration wherein multiple inputs and multiple outputs are present, such as those illustrated in FIGS. 3C, 3D and 3E. In the switch, the transistors are segmented into banks of transistors, QSE1, QSE2 . . . and QSEN, which are coupled in series with the RF branches, respectively, and QSH1, QSH2 . . . and QSHN, which are coupled in shunt with the RF branches, respectively. The banks of transistors in shunt are provided primarily for enhancing isolation. Each of the banks, QSE1, QSE2 . . . and QSEN and QSH1, QSH2 . . . and QSHN, represents a group of segmented transistors. For example, either in series or in shunt, the Mth bank, QM, has the Mth group of segmented transistors, q1, q2 . . . and qK, where 1≤M≤N and 2≤K. In forming a switch, such as the example in FIG. 5, the number of the banks in shunt may be equal to or different from the number of the banks in series. For example, the switch may be configured to have a pair of series and shunt banks in each branch, or have all banks in series with no banks in shunt or vice versa. Additionally, the switch may be configured so that each of one or more branches has a pair of series and shunt banks, and each of the other branches has only a series bank. Furthermore, each branch may be configured to have more than one series bank and/or more than one shunt bank. The banks, QSE1, QSE2 . . . and QSEN and QSH1, QSH2 . . . and QSHN, are configured to be individually switched on and off or biased according to the respective gate voltages.

Figure 6:
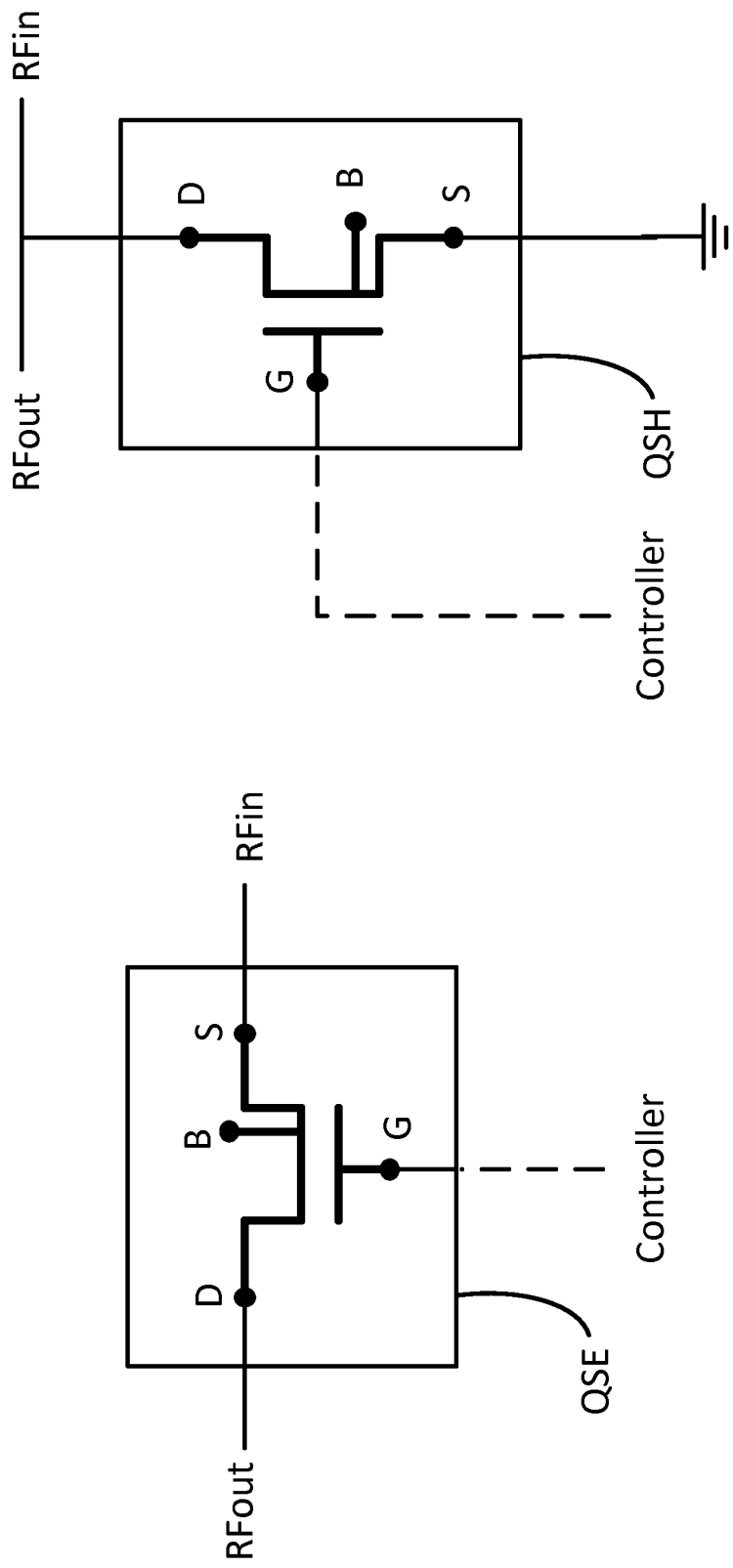
FIG. 6 illustrates a MOSFET representation of a bank of transistors in series, QSE, and a bank of transistors in shunt, QSH.

FIG. 6 illustrates a MOSFET representation of a bank of transistors in series, QSE, and a bank of transistors in shunt, QSH. Conventionally, the source, gate and drain terminals of the transistors, such as q1, q2 . . . and qK in each bank, are coupled to their respective common source (S), gate (G) and drain (D) terminals, and are simultaneously controlled by the gate voltage specific to the bank. The control may be handled by the controller such as 212 in FIG. 2. In the bank of transistors in series, QSE, the drain (D) is coupled to the output port labeled RFout and the source (S) is coupled to the input port labeled RFin, in this example. Another configuration is possible by coupling the drain (D) to the input port RFin and coupling the source (S) to the output port RFout. In the bank of transistors in shunt, QSH, the drain is coupled to the RF path coupling the input port RFin and the output port RFout, and the source (S) is coupled to the ground. Another configuration is possible by coupling the drain (D) to the ground and by coupling the source (S) to the RF path coupling the input port RFin and the output port RFout. Conventionally, the body terminals of the transistors are coupled to the common body (B) terminal, which is located on the back side of the substrate.

Figure 7:
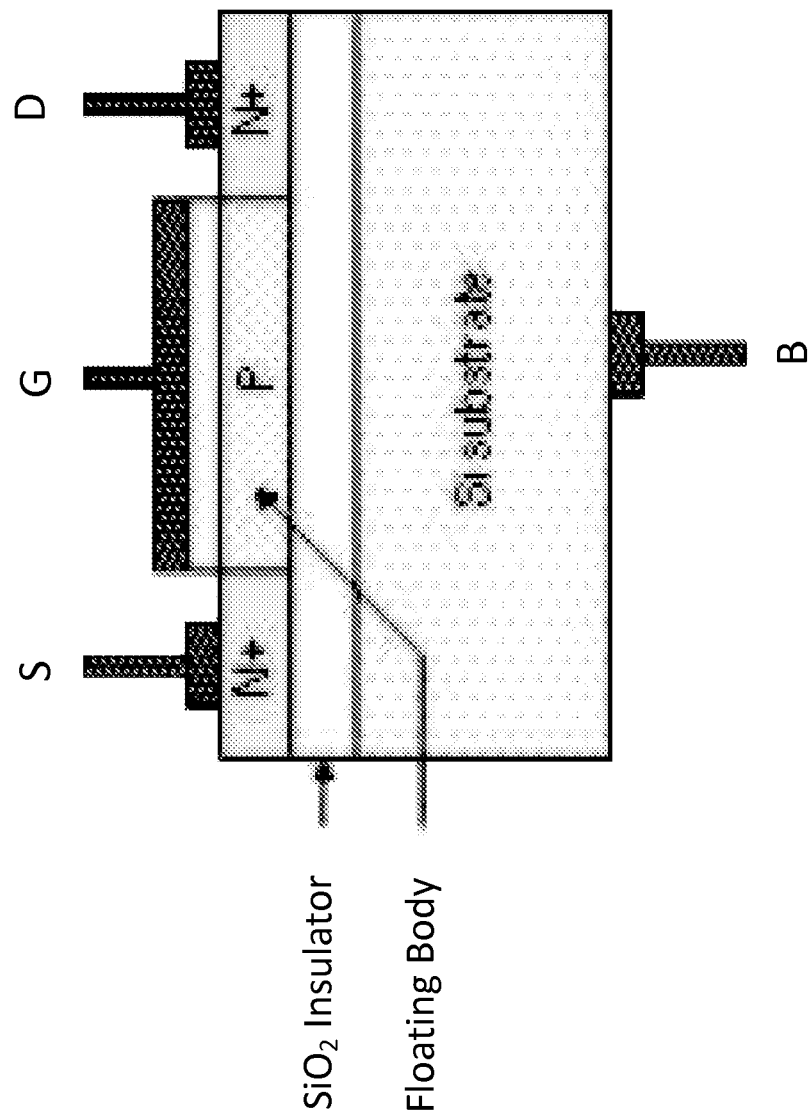
FIG. 7 is a cross sectional view illustrating an example of a partially-depleted silicon-on-insulator (SOI) NMOS transistor.

FIG. 7 is a cross-sectional view illustrating an example of a partially-depleted SOI NMOS transistor. The insulator layer, labeled $SiO_2$ insulator, is formed in the Si substrate. The N+ doped regions and the floating body are formed on one side of the substrate, and coupled to the source (S), drain (D) and gate (G) terminals, respectively. The body (B) terminal is coupled to the back side of the substrate. The PN junctions are normally reverse-biased or unbiased, and do not conduct forward current. The body may be set at the lowest voltage in the circuit, for example, 2.5V for the ON state and 0V for the OFF state. When the gate voltage is applied, the inversion layer is present and the NMOS is turned on.

To enhance device performance and efficiency for RF applications, linearity of power transfer (output power versus input power), in addition to insertion losses and other characteristics mentioned earlier, needs to be taken into consideration. In general, RF switches have high linearity requirements, for example, less than −45 and −40 dBm for $2^{nd}$ and $3^{rd}$ harmonics of output power, respectively, at +35 dBm input power. These linearity requirements are expected to become even more stringent for advanced multi-band multi-mode mobile devices with new standards/protocols. Reduction of harmonic distortion and associated linearity enhancement is thus an important factor in designing high-performance RF communication systems. RF signals carried by wiring, bond pads and/or silicon devices displace inversion electrons from the interface over the negative swing in the AC cycle. The variation of carrier distribution in the substrate with the applied bias or large RF signals can lead to weakly-varying C-V characteristics, and thus nonlinear capacitance and conductance associated with the substrate. These variable capacitance and conductance in the substrate can cause significant harmonic distortion in signal lines and components. Furthermore, this mechanism can often couple the RF power to the substrate, resulting in larger than expected substrate losses. As the transistor size increases, the insertion loss and the linearity typically improve in the SOS technology, whereas in the convention SOI technology the insertion loss may improve but the linearity may remain undesirable. It is generally more costly to fabricate SOS devices than SOI devices. Accordingly, considerations on designs and control schemes of RF switches may include integrations of the RF switches by using the SOI fabrication technology while achieving enhanced linearity comparable to or even better than the linearity metric associated with the SOS devices. Although the present designs and control schemes of RF switches are described below based on the SOI technology, these features can be implemented by using not only the SOI CMOS technology but also the conventional Si CMOS, GaAs- or InP-based bipolar technology, or any other suitable fabrication technology.

As explained earlier with reference to FIG. 6, the body voltages of individual transistors in a bank are normally coupled to have a common body (B) terminal, which is set at a fixed voltage such as 0V or another voltage depending on the ON/OFF states. Based on the fact that the variable capacitance and conductance in the substrate can cause significant harmonic distortion, this document considers implementations and examples for linearity enhancement by individually adjusting the body voltages to optimize the properties of the substrate, such as the capacitance, conductance, resistivity and the like.

Figure 8:
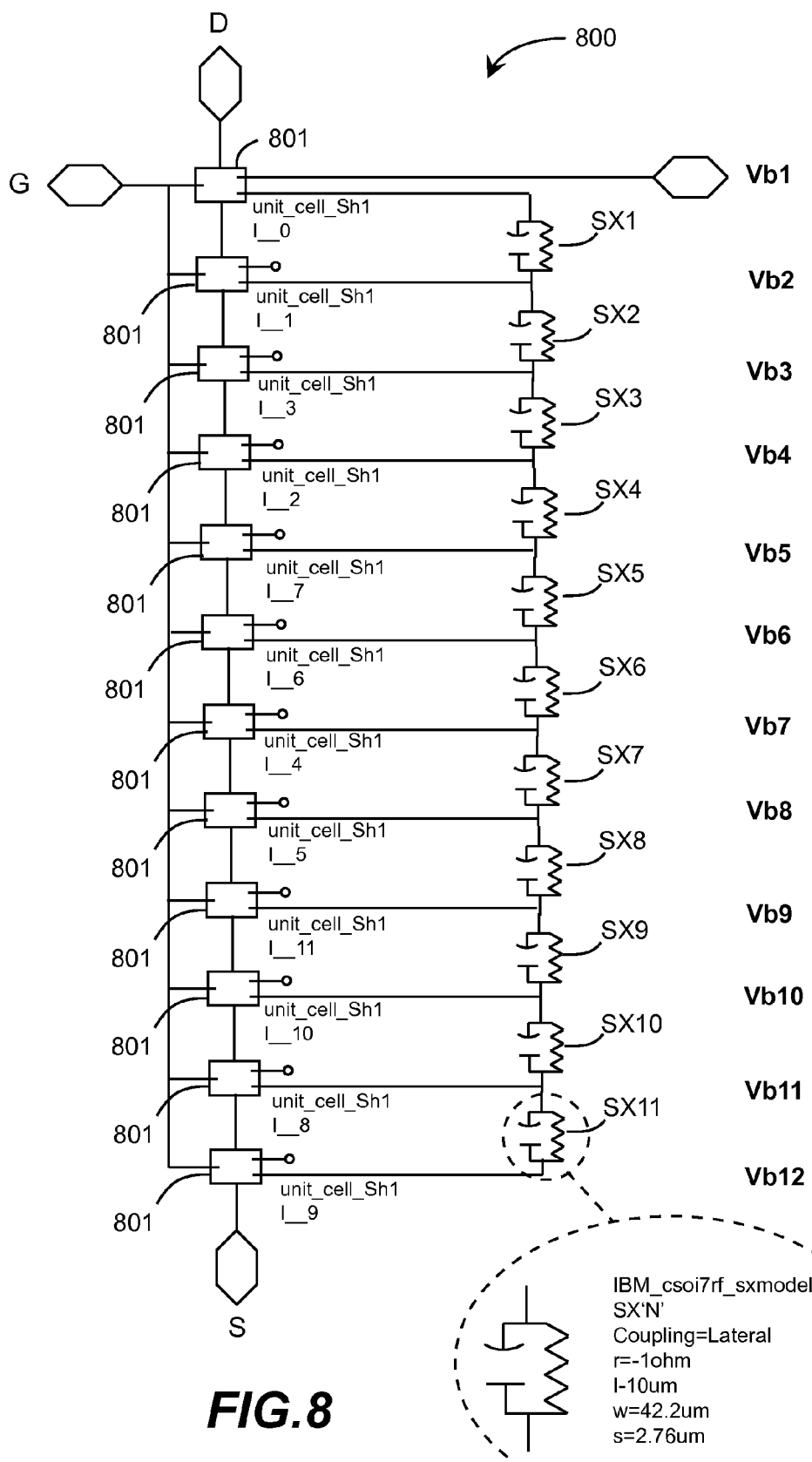
FIG. 8 illustrates an example of a bank of transistors in shunt, in which the body terminals of individual transistors are biased at respective voltages.

FIG. 8 illustrates an example of a bank of transistors in shunt, in which the body terminals of individual transistors are biased at respective voltages. In this example, there are twelve transistors 801 in the bank 800, and each transistor 801 is depicted using a manufacturer-provided model. The body voltages, Vb1, Vb2 . . . and Vb12, are individually controlled by the controller, such as 212 in FIG. 2. The gate (G), the drain (D) and the source (S) are commonly coupled to provide the MOSFET functionality with the I-V characteristics with the gate voltage controlled by the controller, such as 212 in FIG. 2. The number of transistors can be varied according to required current and power handling capabilities. The transistors may be configured to be in series, in shunt, stacked or of any combinations, as long as the overall configuration is in shunt in the example of FIG. 8.

Figure 9:
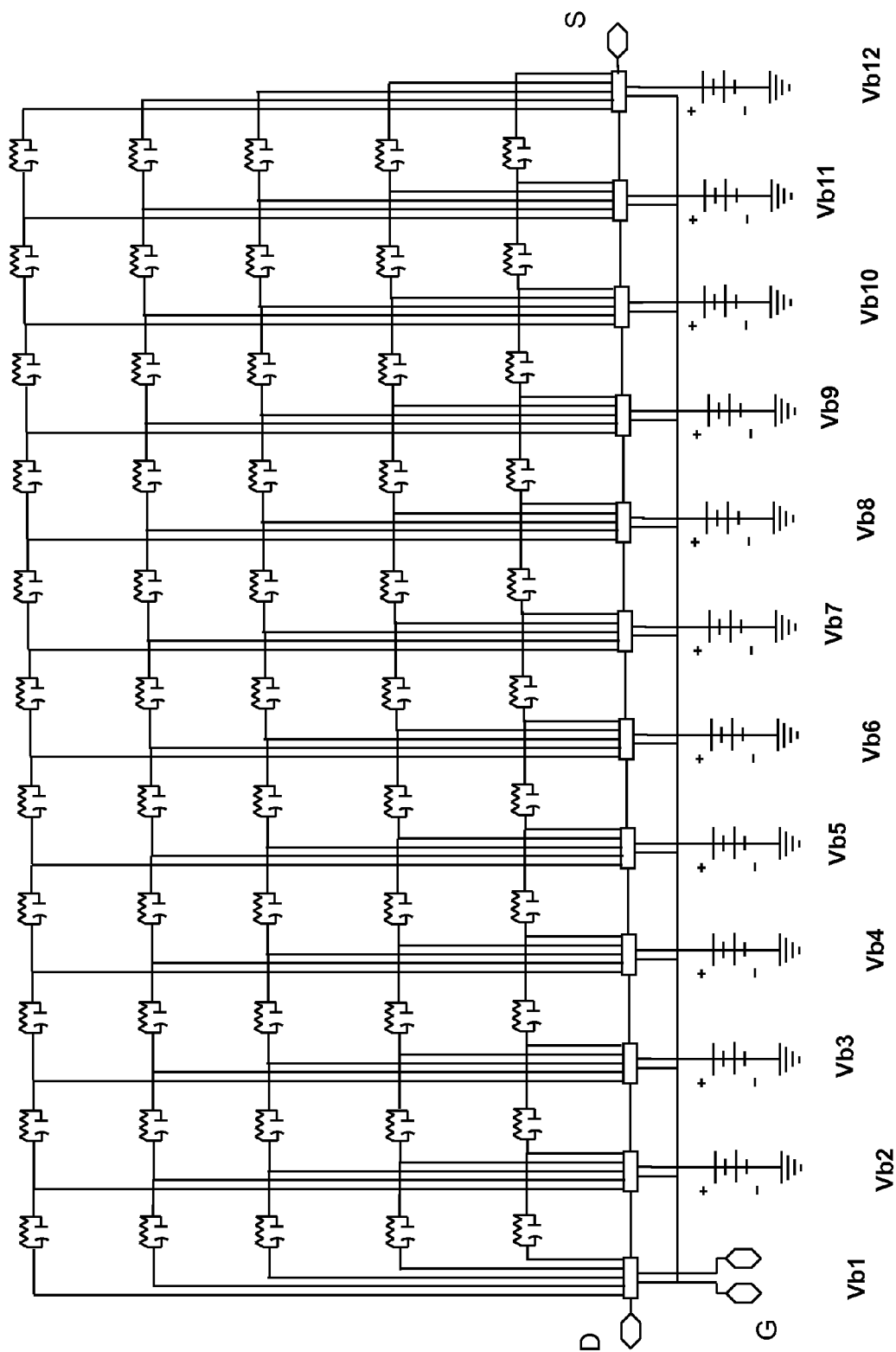
FIG. 9 illustrates an example of a bank of transistors in series, in which the body terminals of individual transistors are biased at respective voltages.

FIG. 9 illustrates an example of a bank of transistors in series, in which the body terminals of individual transistors are biased at respective voltages. In this example, there are twelve transistors stacked in four rows in the bank, and each transistor is depicted using a manufacturer-provided model. The body voltages, Vb1, Vb2 . . . and Vb12, are individually controlled by the controller, such as 212 in FIG. 2. The gate (G), the drain (D) and the source (S) are commonly coupled to provide the MOSFET functionality with the I-V characteristics with the gate voltage controlled by the controller, such as 212 in FIG. 2. The number of transistors can be varied according to required current and power handling capabilities. The transistors may be configured to be in series, in shunt, stacked or of any combinations, as long as the overall configuration is in series as in the example of FIG. 9.

A bank of transistors with individual body biases may replace a bank of transistors with a fixed common body bias such as the QSE and QSH illustrated in FIG. 6. These banks may be configured to form a wide variety of switches in the system. For example, a single-pole-N-throw switch as illustrated in FIG. 5 may be implemented as switches SW1, SW2 . . . and SWN in the system of FIG. 2. Another example may be a single-pole-single-throw switch by setting N=1 in the above single-pole-N-throw example, and may be implemented as switches S1, S2 . . . and SN in the tunable matching network of FIG. 1 and/or switches SW1-1, SW1-2 . . . and SW N-2 in the matching and isolation section 210 in FIGS. 3, 3A and 3B. Yet another example is a multiple-pole-multiple-throw switch such as those illustrated in FIGS. 3C, 3D and 3E. The multiple-pole-multiple-throw switch may be symmetric or asymmetric; that is, the number of input ports may be configured to be equal to or different from the number of output ports. The number and configuration of the banks in a switch may vary depending on the application; that is, each switch may be configured to have one or more banks, where each bank may be coupled in shunt or in series, and thus overall, a wide variety of configurations are possible.

As seen above, a wide variety of switches may be used in a communication system, and thus the number of integrated transistors in the whole system can reach a very large number. Therefore, the number of body voltages of the transistors to be controlled individually will reach very large number as well. However, the required memory size and speed are well within the capability and capacity of the present-day memory technology, such as read only memory (ROM), random access memory (RAM), field-programmable gate array (FPGA), etc.

Figure 10:
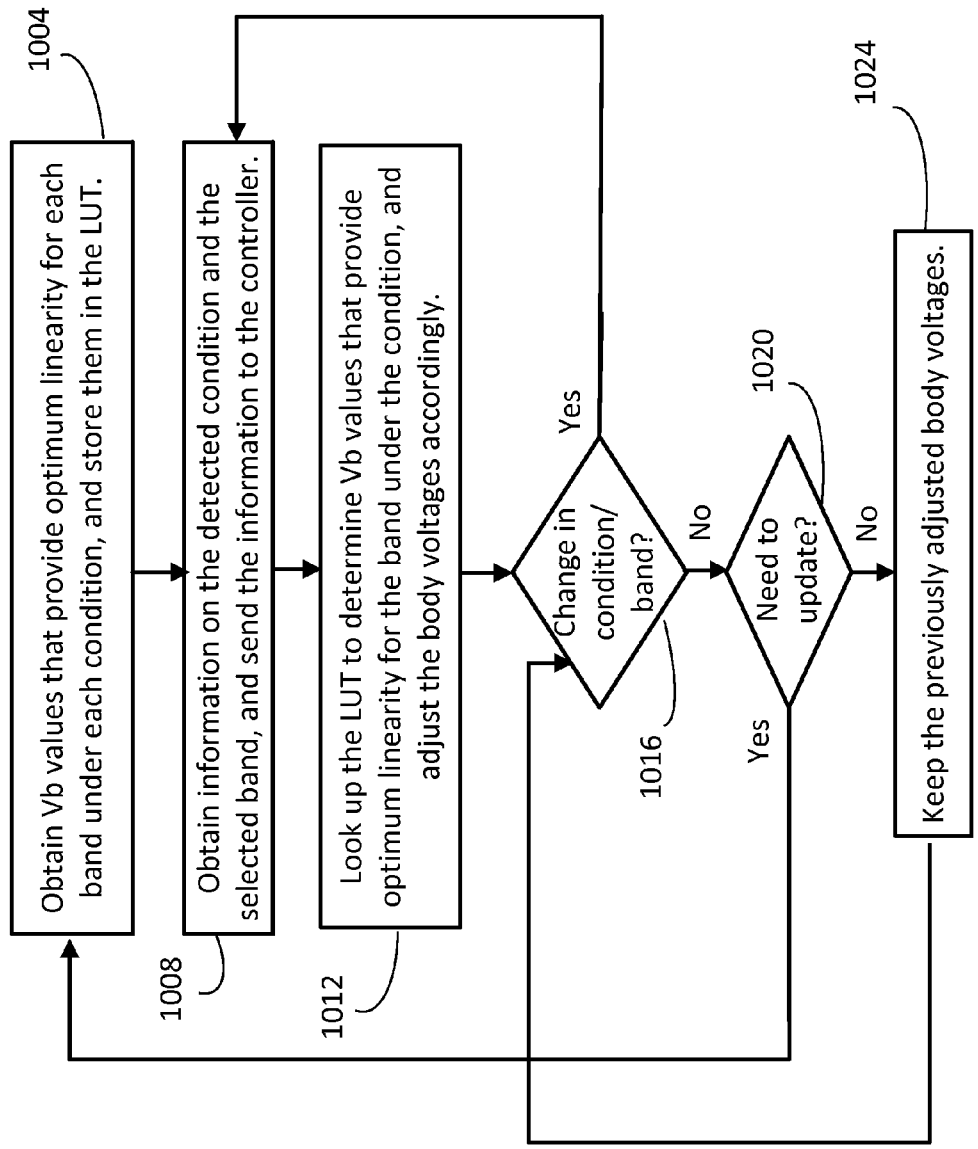
FIG. 10 illustrates an example of a process to obtain optimum linearity by controlling the individual body voltages.

FIG. 10 illustrates an example of a process to obtain optimum linearity by controlling the individual body voltages. The algorithm for processing the steps may be included in the controller, such as 212 in FIG. 2. The LUT 216 in FIG. 2 tabulates measured and/or predetermined data associated with antenna characteristics, as exemplified in FIG. 4, and the algorithm is configured to optimize the system performance with reference to the entries in the LUT 216 according to the frequency band selected and time-varying conditions/environments, such as perturbations due to the placement of a head, a hand, or other interference-causing objects nearby. In addition to impedance states and other characterization data, the LUT 216 can be configured to include individual body voltage (Vb) values, Vb1, Vb2 . . . and VbN, where N is the total number of transistors, which provide optimum linearity for each band selected and under each condition. These Vb values may be premeasured or predetermined, and stored beforehand in the LUT 216 according to the bands and conditions in step 1004. The optimum linearity may be defined as the linearity providing the second and third harmonic components of output power less than respective thresholds, for example. Once the system is turned on, the condition is detected by the sensor 220, for example. The information on the frequency band selected during a time interval may be handled by a CPU or an application CPU, for example. In step 1008, information on the detected condition and the selected frequency band is sent to the controller 212. In step 1012, the controller 212 is configured to look up the LUT 216 to determine Vb values that provide optimum linearity for the band selected and under the condition detected, and adjust the individual body voltages accordingly. If there is a change in condition and/or band in step 1016, the process goes back to step 1008 to obtain new information on the detected condition and the selected band. If there is a need for updating the entries of the LUT 216 in step 1020, the process goes back to step 1004 to obtain new Vb values that provide optimum linearity for each band and under each condition, and store them in the LUT 216. While the condition and the band remain unchanged and the LUT 216 has no need for update, the body voltages of the transistors of the system are kept the same as in step 1024.

Figure 11:
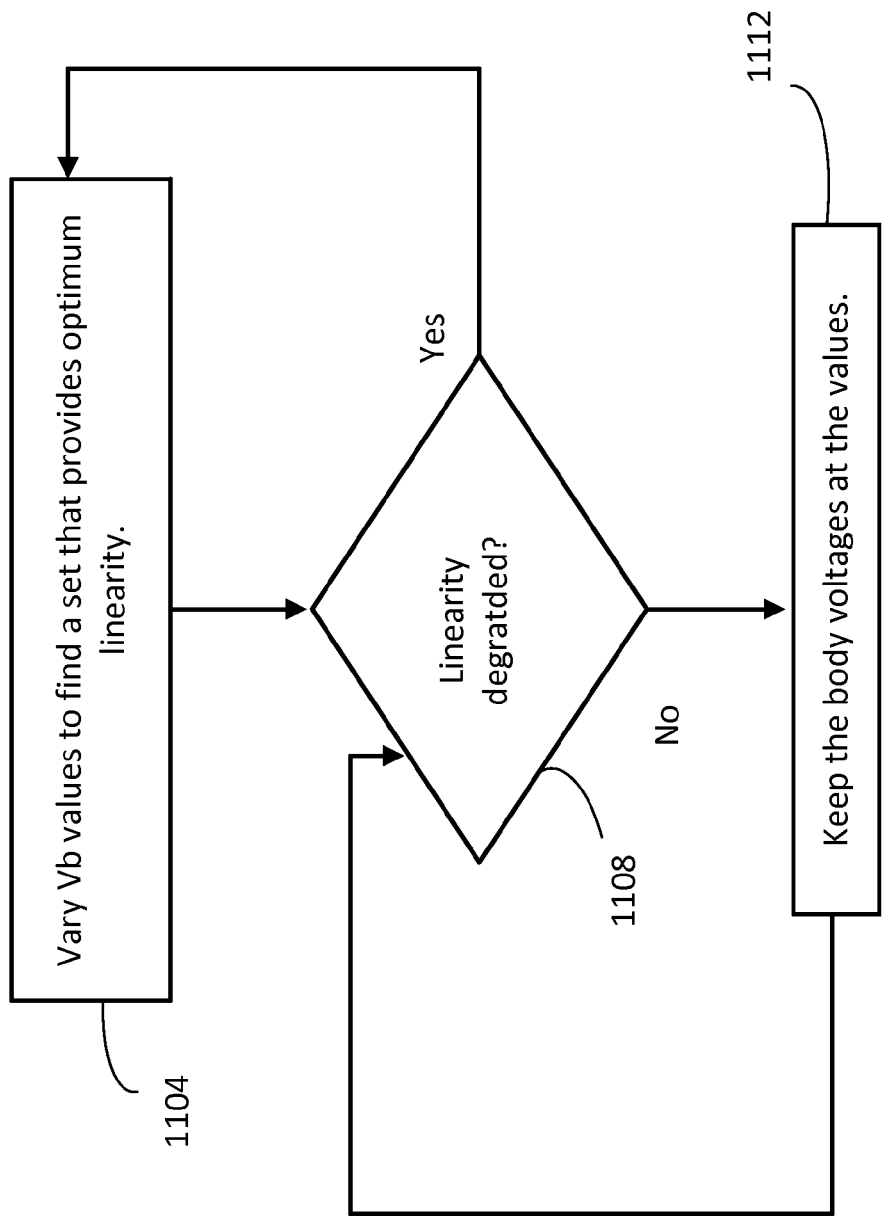
FIG. 11 illustrates another example of a process to obtain optimum linearity by controlling the individual body voltages.

FIG. 11 illustrates another example of a process to obtain optimum linearity by controlling the individual body voltages. Unlike the example of FIG. 10, the present example does not utilize the LUT, such as 216 in FIG. 2. When the system is turned on, the controller 212 starts varying the body voltage (Vb) values of the transistors to find a set of Vb values that provides optimum linearity in step 1104. The Vb values may be varied based on random numbers with a predetermined variation range, for example. Multivariate statistics or any other techniques known to those skilled in the art can be used for the variation and analysis. The optimum linearity may be defined as the linearity providing the second and third harmonic components of output power less than respective thresholds, for example. Thus, the output power may be monitored while the Vb values are varied to evaluate the linearity. Linearity may sometimes degrade due to changes in conditions/environments, in frequency band and mode or any other scenarios surrounding and/or inside the system. The degradation may be judged based on predetermined criteria; for example, the linearity is determined to be degraded when the second and third harmonics increase beyond respective predetermined thresholds. If it is determined in step 1108 that the linearity degradation occurred, the process goes back to step 1104 to vary the Vb values of the transistors to find a new set of Vb values that provides optimum linearity for the new time interval. Otherwise, the body voltages of the transistors of the system are kept the same as in step 1112.

Figure 12:
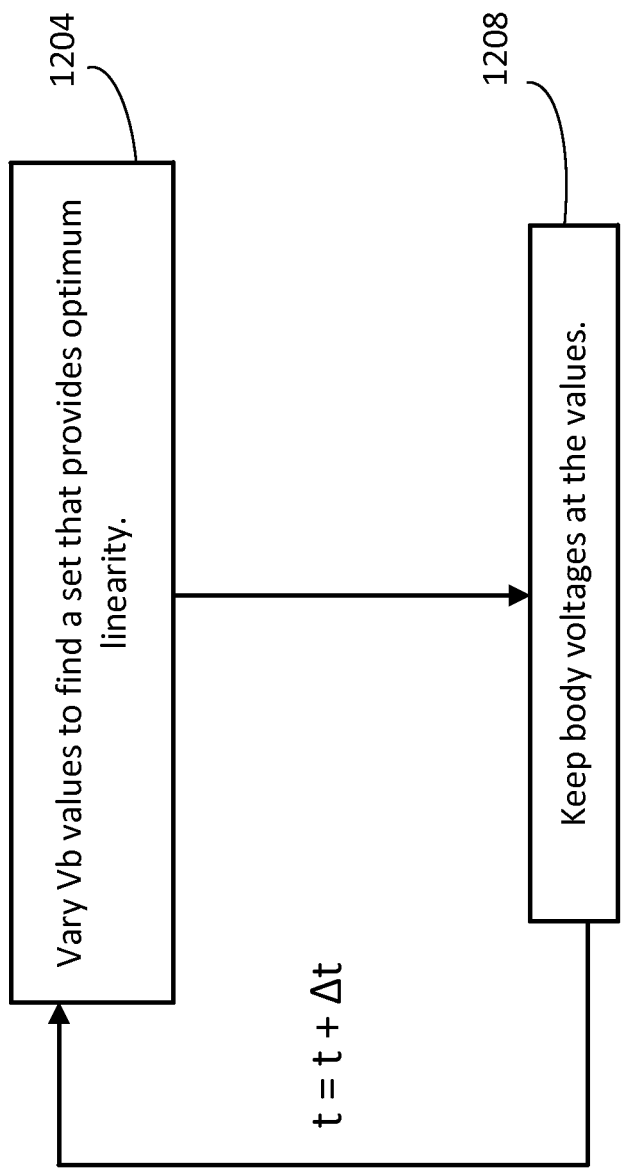
FIG. 12 illustrates yet another example of a process to obtain optimum linearity by controlling the individual body voltages.

FIG. 12 illustrates yet another example of a process to obtain optimum linearity by controlling the individual body voltages. Unlike the example of FIG. 10, the present example does not utilize the LUT, such as 216 in FIG. 2. When the system is turned on, the controller 212 starts varying the body voltage (Vb) values of the transistors to find a set of Vb values that provides optimum linearity in step 1204, and the body voltages are kept at the values as in step 1208. The Vb values may be varied based on random numbers with a predetermined variation range, for example. Multivariate statistics or any other techniques known to those skilled in the art can be used for the variation and analysis. The optimum linearity may be defined as the linearity providing the second and third harmonic components of output power less than respective thresholds, for example. Thus, the output power may be monitored while the Vb values are varied to evaluate the linearity. Linearity may sometimes degrade due to changes in conditions/environments, in frequency band and mode or any other scenarios surrounding and/or inside the system. Instead of judging if the degradation occurred based on predetermined criteria and then varying Vb values again to find a sew set that provides optimum linearity as in FIG. 11, the example in FIG. 12 repeats varying Vb values to find a new set that provides optimum linearity at predetermined time steps with an interval Δt. This loop of steps 1204 and 1208 may be repeated until the system is turned off.

Figure 13:
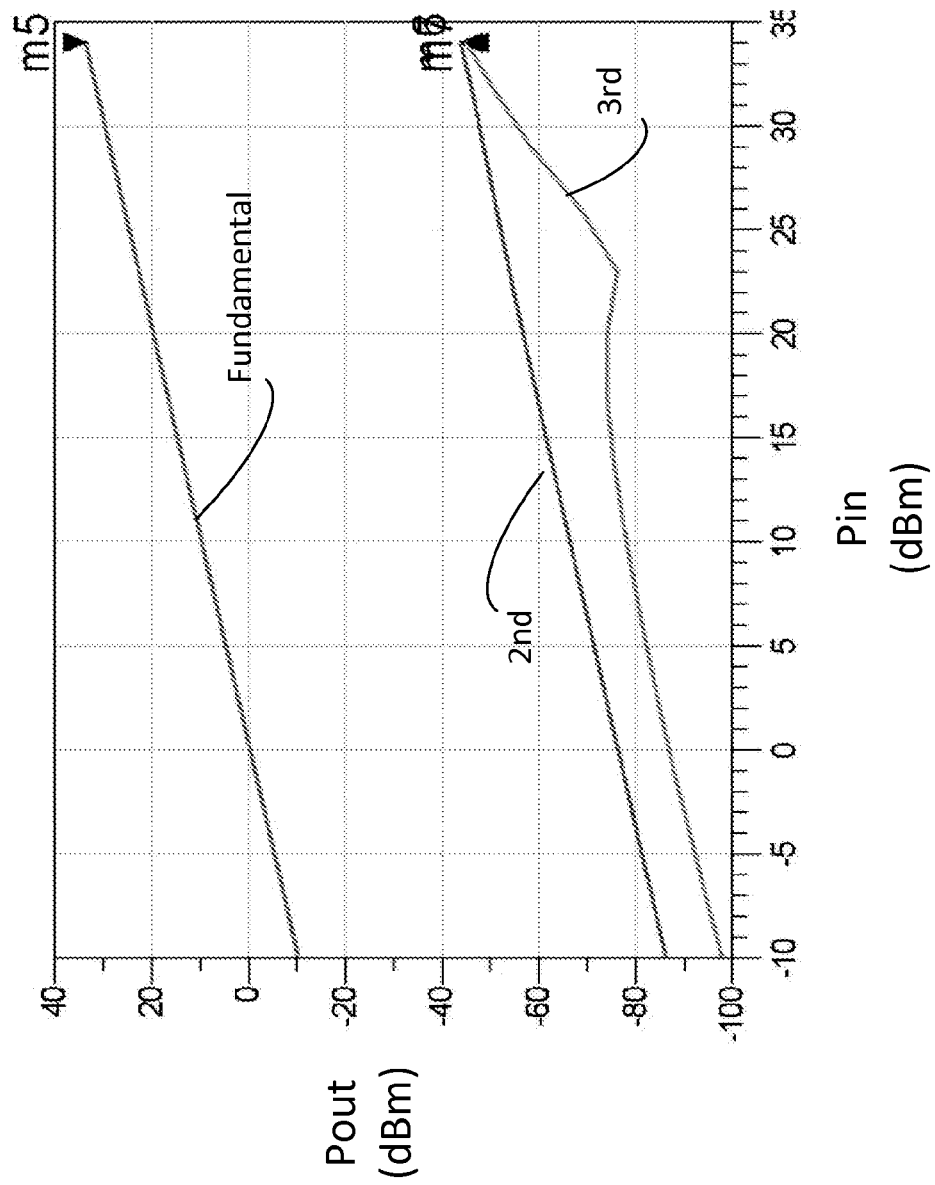
FIG. 13 is a plot showing an example of a simulation result for linearity enhancement.

FIG. 13 is a plot showing an example of a simulation result for linearity enhancement. The bank of transistor in shunt in FIG. 8 and the bank of transistors in series in FIG. 9 are used to form a SPST switch. Namely, the configuration of having only QSH1 and QSE1 in FIG. 5 is considered, where one end is coupled to RFin and the other end is coupled to RFout1. The bank of transistors in shunt is used primarily to improve isolation. In this simulation, the 12 body voltages associated with the transistors of the bank in shunt are fixed at the same bias, whereas in the bank in series, one body voltage is set at 0V and the other 11 body voltages are set at −2.5V. It is seen from the result that even with the small variation in body voltages, the $2^{nd}$ and $3^{rd}$ harmonics are significantly reduced, leading to improved linearity.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

What is claimed is:

1. A switch comprising:
   a bank of transistors fabricated on a substrate;
   each of the transistors in the bank comprising a respective body terminal, and
   each bank are each of the respective body terminals configured to be individually controlled to have a respective body voltage.

2. The switch of claim 1, wherein
   values of the respective body voltages of each of the transistors in the bank are determined to provide optimum linearity of power transfer by changing properties of the substrate with respect to the properties of the substrate when the body voltages are commonly biased at a value.

3. The switch of claim 1, wherein
   the bank of transistors is fabricated using a silicon-on-insulator (SOI) CMOS technology.

4. The switch of claim 2, wherein
   the linearity is determined to be optimum when second and third harmonic components of output power decrease below respective predetermined thresholds.

5. A communication system comprising:
   a plurality of paths for processing RF signals in one or more frequency bands;
   a plurality of switches coupled to the plurality of paths to direct the RF signals with isolation, each of the plurality of switches comprising a bank of transistors, each of the transistors in the bank comprising a respective body terminal; and
   the communication system further comprising a controller configured to control the plurality of switches,
   wherein
   each of the respective body terminals is configured to be individually controlled to have a respective body voltage.

6. The communication system of claim 5, wherein
   the bank of transistors is fabricated on a substrate, and values of the respective body voltages are determined to provide optimum linearity of power transfer by changing properties of the substrate with respect to the properties of the substrate when the body voltages are commonly biased at a value.

7. The communication system of claim 6, wherein
   the linearity is determined to be optimum when second and third harmonic components of output power decrease below respective predetermined thresholds.

8. The communication system of claim 6, wherein
   the controller is configured to vary the values of the respective body voltages to find a set of values that provides the optimum linearity when the linearity degrades below predetermined criteria.

9. The communication system of claim 6, wherein
   the controller is configured to vary the values of the respective body voltages to find a set of values that provides the optimum linearity at predetermined time steps.

10. The communication system of claim 6, further comprising:
    a look-up table including characterization data according to frequency bands and conditions,
    wherein
    the values of the respective body voltages that provide the optimum linearity are predetermined and stored in the look-up table according to the frequency bands and the conditions, and the controller controls each of the respective body terminals of the transistors, with reference to the look-up table, to have the respective body voltages according to the frequency band selected and the condition detected during a time interval.

11. The communication system of claim 10, further comprising:
    one or more sensors that detect the condition during the time interval, wherein
    the controller receives information on the frequency band selected and on the condition from the one or more sensors, and uses the information upon referring to the look-up table to control each of the respective body terminals of the transistors to provide the optimum linearity.

12. A method of optimizing linearity of power transfer in a communication system that comprises a plurality of paths for processing RF signals in one or more frequency bands, a plurality of switches coupled to the plurality of paths to direct the RF signals with isolation, each of the plurality of switches comprising a bank of transistors, and a controller configured to control the plurality of switches, wherein each of the transistors in the bank comprises a respective body terminal, and each of the respective body terminals of the transistors is configured to be individually controlled to have respective body voltages, the method comprising:
    varying values of the respective body voltages of each of the transistors to find a set that provides optimum linearity; and
    keeping the respective body voltages at the respective values in the set.

13. The method of claim 12, further comprising:
    determining that the linearity is optimum when second and third harmonic components of output power decrease below respective predetermined thresholds.

14. The method of claim 12, wherein
    the varying is carried out when the linearity degrades below predetermined criteria.

15. The method of claim 12, wherein
the varying is carried out at predetermined time steps.

16. The method of claim 12, wherein
the communication system further includes a look-up table, and the values of each of the respective body voltages that provide the optimum linearity are predetermined and stored in the look-up table according to frequency bands and conditions,
and wherein
the varying includes controlling each of the respective body terminals of the transistors, with reference to the look-up-table, to have the respective body voltages according to the frequency band selected and the condition detected during a time interval.

\* \* \* \* \*

UNITED STATES PATENT AND TRADEMARK OFFICE
CERTIFICATE OF CORRECTION

PATENT NO. : 9,490,863 B2
APPLICATION NO. : 13/717550
DATED : November 8, 2016
INVENTOR(S) : Dupuy et al.

Page 1 of 1

It is certified that error appears in the above-identified patent and that said Letters Patent is hereby corrected as shown below:

In the Claims

Column 13, Lines 33-39, should read:
A switch comprising:
a bank of transistors fabricated on a substrate;
each of the transistors in the bank comprising a respective body terminal, and
each of the respective body terminals configured to be individually controlled to have a respective body voltage.

Signed and Sealed this
Twenty-first Day of March, 2017

Michelle K. Lee
*Director of the United States Patent and Trademark Office*